(12) United States Patent
Hoka et al.

(10) Patent No.: US 10,578,929 B2
(45) Date of Patent: Mar. 3, 2020

(54) LIQUID CRYSTAL DISPLAY PANEL (71) Applicant: Mitsubishi Electric Corporation, Tokyo (JP)

(72) Inventors: Naruhito Hoka, Tokyo (JP); Kazunori Okumoto, Tokyo (JP); Manabu Tanahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/972,254

(22) Filed: May 7, 2018

(65) Prior Publication Data
US 2018/0356667 A1 Dec. 13, 2018

(30) Foreign Application Priority Data

Jun. 7, 2017 (JP) ................ 2017-112603

(51) Int. Cl.
| | |
|---|---|
| *G02F 1/1339* | (2006.01) |
| *G02F 1/1335* | (2006.01) |
| *G02F 1/1343* | (2006.01) |
| *G02F 1/1362* | (2006.01) |
| *G02F 1/1368* | (2006.01) |
| *G02F 1/1333* | (2006.01) |
| *H01L 27/12* | (2006.01) |
| *H01L 29/417* | (2006.01) |
| *H01L 29/786* | (2006.01) |

(52) U.S. Cl.
CPC ........ *G02F 1/13394* (2013.01); *G02F 1/1368* (2013.01); *G02F 1/133512* (2013.01); *G02F 1/133514* (2013.01); *G02F 1/134336* (2013.01); *G02F 1/136227* (2013.01); *G02F 1/133345* (2013.01); *G02F 1/134363* (2013.01); *G02F 2001/134318* (2013.01); *G02F 2201/123* (2013.01); *G02F 2201/56* (2013.01); *H01L 27/124* (2013.01); *H01L 29/41733* (2013.01); *H01L 29/78618* (2013.01)

(58) Field of Classification Search
CPC .................. G02F 2001/13396; G02F 1/13394
See application file for complete search history.

(56) References Cited

U.S. PATENT DOCUMENTS

| | | | |
|---|---|---|---|
| 6,097,467 A | 8/2000 | Fujimaki et al. | |
| 7,864,284 B2 | 1/2011 | Morii et al. | |
| 2001/0052959 A1 | 12/2001 | Tamatani et al. | |
| 2005/0036094 A1 | 2/2005 | Tamatani et al. | |
| 2005/0052590 A1* | 3/2005 | Ochiai | G02B 6/0068 349/71 |

(Continued)

FOREIGN PATENT DOCUMENTS

| | | |
|---|---|---|
| JP | H10-048636 A | 2/1998 |
| JP | 2003-287759 A | 10/2003 |

(Continued)

*Primary Examiner* — Alexander P Gross
(74) *Attorney, Agent, or Firm* — Studebaker & Brackett PC (57) ABSTRACT

Provided is a liquid crystal display panel including a first pixel that is brought into abutment against a photospacer, second pixels having opening regions of the same color as a color of an opening region of the first pixel, and third pixels being other pixels and having the largest area of opening regions. A distance between a photospacer set position and a through-hole in each pixel is larger in the first pixel and in the second pixels than in the third pixels.

8 Claims, 5 Drawing Sheets

(56) References Cited

U.S. PATENT DOCUMENTS

| | | | |
|---|---|---|---|
| 2005/0270471 A1 | 12/2005 | Kitagawa et al. | |
| 2007/0139605 A1* | 6/2007 | Matsuda | G02F 1/133308 349/158 |
| 2011/0141425 A1 | 6/2011 | Moriya et al. | |
| 2011/0149186 A1* | 6/2011 | Song | G02F 1/136227 349/42 |
| 2012/0326954 A1* | 12/2012 | Itsumi | G02F 1/1368 345/92 |
| 2015/0277188 A1* | 10/2015 | He | G02F 1/133617 349/69 |
| 2015/0346534 A1* | 12/2015 | Lee | G02F 1/13394 349/43 |
| 2018/0292704 A1* | 10/2018 | Hirosawa | G02F 1/133512 |

FOREIGN PATENT DOCUMENTS

| | | |
|---|---|---|
| JP | 2005-345819 A | 12/2005 |
| JP | 2007-003779 A | 1/2007 |
| WO | 2009/128123 A1 | 10/2009 |

\* cited by examiner

LIQUID CRYSTAL DISPLAY PANEL

BACKGROUND OF THE INVENTION

Field of the Invention

The present invention relates to a liquid crystal display panel, and more particularly to a liquid crystal display panel in which a cell thickness is maintained by a photospacer formed in a substrate.

Description of the Background Art

A liquid crystal display panel includes a pair of substrates arranged so as to be opposed to each other, and a liquid crystal layer provided between both of the substrates. In one of the pair of the substrates, a pixel electrode that corresponds to a pixel of a liquid crystal display device and a wire that is connected to a switching element, such as a thin film transistor, are formed. Thus, the one of the pair of the substrates may be referred to as an array substrate or an active matrix substrate. The other substrate may be referred to as a counter substrate. Further, in the liquid crystal display panel, a thickness of the liquid crystal layer, that is, a cell thickness, is fixedly maintained by a plurality of spacers provided between the pair of substrates.

In order to enhance in-plane uniformity of the cell thickness, the plurality of spacers are formed in surfaces between both of the substrates. As a method of arranging spacers, there is a method of dispersing spherical spacers; however, in recent years, a method of forming columnar photospacers through photolithography and then arranging the photospacers on one of the pair of substrates has been used. A photospacer may be simply referred to as a spacer, or may also be referred to as a columnar spacer.

As the position of arranging photospacers, there is known an aspect of arrangement on top of a thin film transistor (TFT) of the array substrate, for example (Japanese Patent Application Laid-Open No. 10-48636 (1998) (FIG. 8)). When photospacers are formed in a transmission region of display light, optical characteristics are adversely affected, such as alignment failure, and also light transmittance is reduced. Therefore, photospacers are generally not provided in a region directly contributing to display; however, the top of the TFT and the vicinity of the TFT are less liable to be subjected to such influence. However, the size of a pixel and a TFT has been reduced along with higher resolution of an LCD in recent years, thereby being more difficult to secure a sufficient region for arranging photospacers.

As a region of forming photospacers, as described above, such a region as a light-blocking region where transmittance is not affected is selected, and other than TFTs, the vicinity of a through-hole forming region is also conceivable. In general, a through-hole (also referred to as a contact hole) is used for connection of a metallic film or the like, and therefore light is often not transmitted therein. Further, even in a case where a through-hole is used for connection between transparent conductive films, it is difficult to align liquid crystal molecules along such a recessed shape. Therefore, in general, light is often blocked in a through-hole forming region as well as its vicinity, using a black matrix or the like. However, higher resolution in recent years requires a light-blocking region in the vicinity of a through-hole to be also narrowed similarly to the vicinity of a TFT. Therefore, the interval distance between a through-hole and photospacers in plan view is required to be narrowed as well.

Therefore, at the time when a photospacer that corresponds to a portion in the vicinity of a through-hole on an active matrix substrate is formed on the counter substrate side to attach the active matrix substrate and the counter substrate, there may arise inconvenience in which the photospacer falls into the through-hole to be caught therein due to factors such as difference in precision. Further, due to such inconvenience, overlapping attachment between the active matrix substrate and the counter substrate is shifted.

When overlapping attachment is shifted, the cell thickness is no longer maintained fixedly in a region where a head portion of a photospacer falls into a through-hole. Thus, stable cell thickness control owing to a photospacer is difficult, resulting in generating display unevenness in a case of display under a high temperature environment. Further, due to the overlapping shift, colors of adjacent pixels are mixed with each other to cause color mixing in display.

As a technology for solving such a problem, there is known a technology of setting shifting directions between through-holes and photospacers to be different directions in each pixel so that, even when head portions of a part of the photospacers fall into the through-holes, other photospacers are prevented from falling, and that reduction of an aperture ratio can be prevented to be further able to contribute to control of a cell thickness (WO 2009/128123 A1).

However, photospacers that have fallen into through-holes do not contribute to control of a cell gap. Therefore, in a case of adopting the above technology, the degree to which the photospacers contribute to the control of a cell gap depends on contingency. In general, a total area and distribution of photospacers need to be set finely in order to prevent publicly-known inconvenience of low-temperature foaming (Japanese Patent Application Laid-Open No. 2003-287759). However, when such contingent factors as above are even taken into consideration, the design margin in forming photospacers is reduced. Therefore, adopting such an aspect assuming falling of only a part of photospacers is not practical.

Further, in order to solve such inconvenience, there is known a technology of separately providing photospacers also in a portion apart from through-holes so as to enable control of the cell thickness (Japanese Patent Application Laid-Open No. 2005-345819). However, this technology also has the same problem as described above.

In view of the above, such is conceivable that through-holes formed in an active matrix substrate and photospacers formed in a counter substrate are arranged apart from each other in plan view so as to prevent head portions of the photospacers of the counter substrate from falling into the through-holes.

However, when photospacers or through-holes project into a transmission region in plan view, the projected portion in the transmission region is ineffective for image display, thus reducing the aperture ratio of a pixel. For example, in a case where at least a part of photospacers are formed to project into a transmission region, alignment in a liquid crystal layer is liable to be disturbed in the vicinity of the photospacers, which brings about a necessity of shielding such a region. However, this reduces the aperture ratio of a pixel.

Further, also in a case where at least a part of through-holes are formed to project into a transmission region, alignment in a liquid crystal layer is liable to be disturbed in the vicinity of the through-holes. Hence, for the same reason as above, the aperture ratio of a pixel is reduced. Further, in a region where alignment in a liquid crystal layer is disturbed in the vicinity of photospacers and through-holes, light leakage may occur to cause deterioration in contrast.

Further, in the technology of the related art, only elements of an active matrix substrate are considered, failing to fully make use of possibilities of further enhancement through total optimization in which panel design such as a color filter is also considered.

In this manner, in a case where through-holes and photospacers are arranged close to each other in a liquid crystal display panel of the related art, it is difficult to maintain stability of cell thickness control and to maintain an aperture ratio of a high-resolution pixel.

SUMMARY

The present invention has an object to prevent display failure caused by change in a cell thickness and to prevent a photospacer from falling into a through-hole in a liquid crystal display panel.

A liquid crystal display panel of the present invention includes an active matrix substrate, a counter substrate, and a liquid crystal layer. The counter substrate is arranged so as to be opposed to the active matrix substrate. The liquid crystal layer is provided between the active matrix substrate and the counter substrate. The active matrix substrate includes a first transparent substrate, a gate wire, a source wire, a switching element, and a pixel electrode. The gate wire is formed on the first transparent substrate. The source wire intersects with the gate wire. The switching element is formed in a pixel that is partitioned by the gate wire and the source wire. The pixel electrode is formed through intermediation of an insulating film with respect to the switching element, and is connected to the switching element via a through-hole opened in the insulating film. The counter substrate includes a second transparent substrate and a spacer. The spacer is formed on the second transparent substrate and is brought into abutment against the active matrix substrate. The pixel includes a first pixel, a second pixel, and a third pixel. Each of the first pixel, the second pixel, and the third pixel has a light-blocking region where light is not transmitted, and an opening region through which light corresponding to one color out of a plurality of types of colors is transmitted. The first pixel is brought into abutment against the spacer in the light-blocking region. The second pixel is not brought into abutment against the spacer, and has an opening region that corresponds to the same color as the color of the opening region of the first pixel. The third pixel is a pixel different from the first pixel and from the second pixel. An area of each of the opening regions of the first pixel and the second pixel is smaller than an area of the opening region of the third pixel. A position of the through-hole in the first pixel is different from a position of the through-hole in the third pixel.

According to the liquid crystal display panel of the present invention, owing to arrangement of the through-hole and the photospacer, stability of a cell thickness can be maintained and an aperture ratio of a high-resolution pixel can be maintained.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
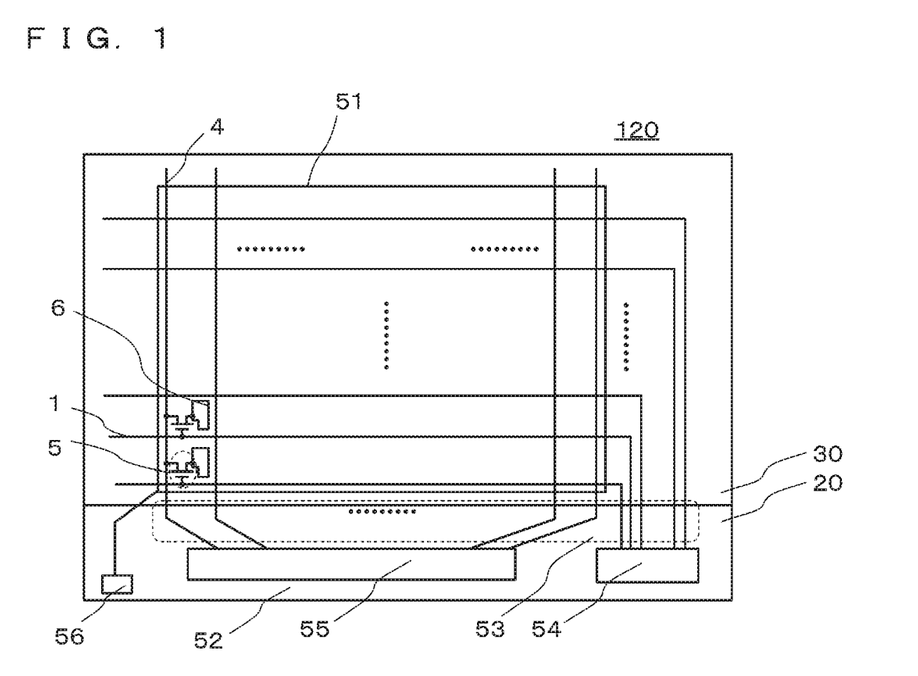
FIG. 1 is a plan view of a liquid crystal display panel according to a first preferred embodiment of the present invention.

Now, detailed description is given of preferred embodiments of the present invention based on the drawings. Note that, the present invention is not to be limited to each of the preferred embodiments below. FIG. 1 is a plan view of a liquid crystal display panel according to the present invention.

A liquid crystal display panel 120 has a structure in which a counter substrate 30 is attached on an active matrix substrate 20 in top view. The counter substrate 30 is smaller than the active matrix substrate 20, and hence has a region in which the active matrix substrate 20 is exposed. In the exposed region, usually, a drive circuit and the like to be described later are formed.

Now, description is given of the active matrix substrate 20. The active matrix substrate 20 has a section of a display region 51 that corresponds to a display screen of a liquid crystal display panel, and a section of a frame region 52 being a peripheral region thereof. A gate wire 1 and a source wire 4 intersect with each other in the display region 51, and a region partitioned by both of the wires corresponds to a pixel. It can be said that the display region 51 is made of a mass of pixels. A thin film transistor 5, being a switching element connected to both of the wires, is provided in each pixel, and each TFT 5 is connected to a pixel electrode 6 in each pixel.

In the frame region 52, a lead-out wire 53 connected to the gate wire 1 or the source wire 4 is extended, which is correspondingly connected to a gate drive circuit 54 or a source drive circuit 55. Usually, both of the drive circuits and the counter substrate 30 are not overlapped with each other as illustrated in the drawing.

A counter electrode (common electrode) is formed in the entire surface of the display region 51, and is maintained to have a common potential by an external terminal 56. As in the later description, a difference between a common potential that is uniform across each of the pixels and a signal voltage that is applied to a pixel electrode of each of the pixels is applied to a liquid crystal layer (not shown), thereby driving liquid crystal molecules to enable display in individual pixels.

Figure 2:
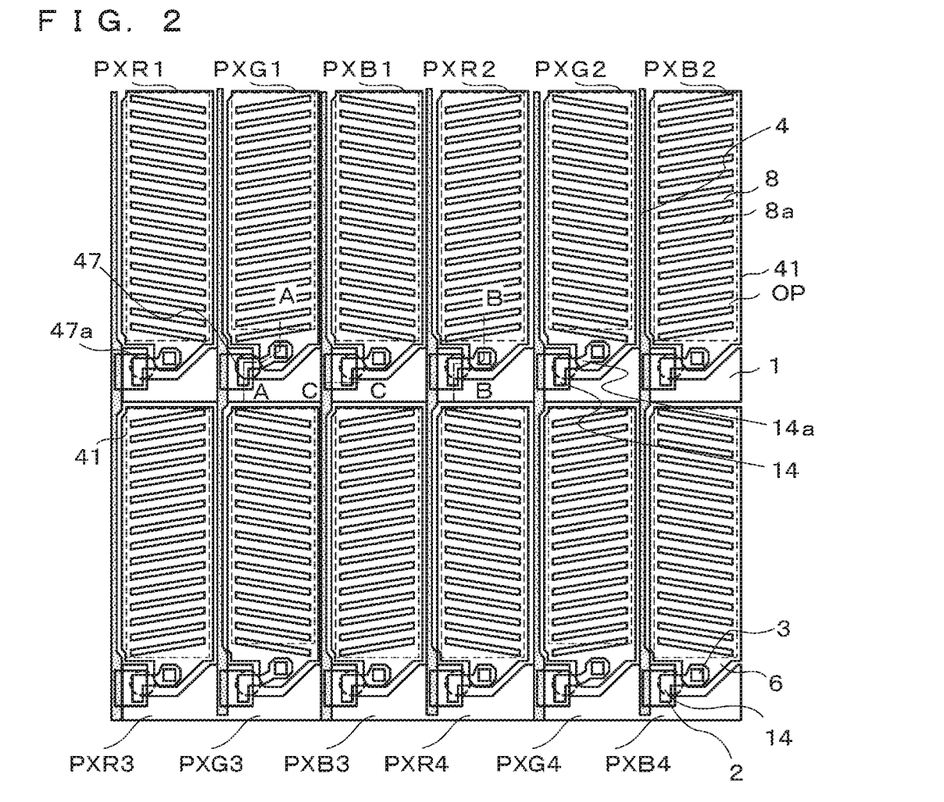
FIG. 2 is a plan view of an active matrix substrate that forms the liquid crystal display panel of the first preferred embodiment of the present invention.
Figure 3:
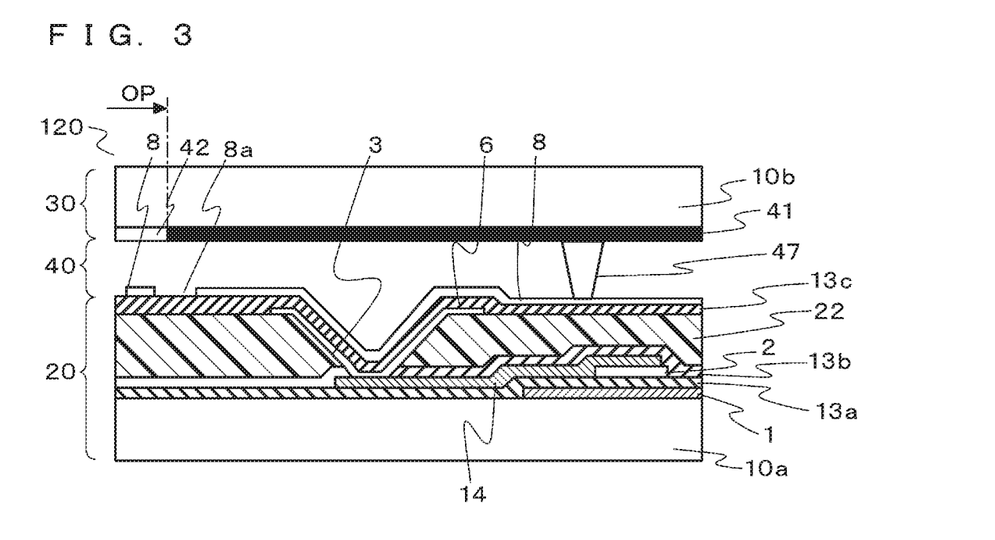
FIG. 3 is a cross-sectional view of the active matrix substrate and the liquid crystal display panel including the active matrix substrate, taken along the line A-A in FIG. 2.
Figure 4:
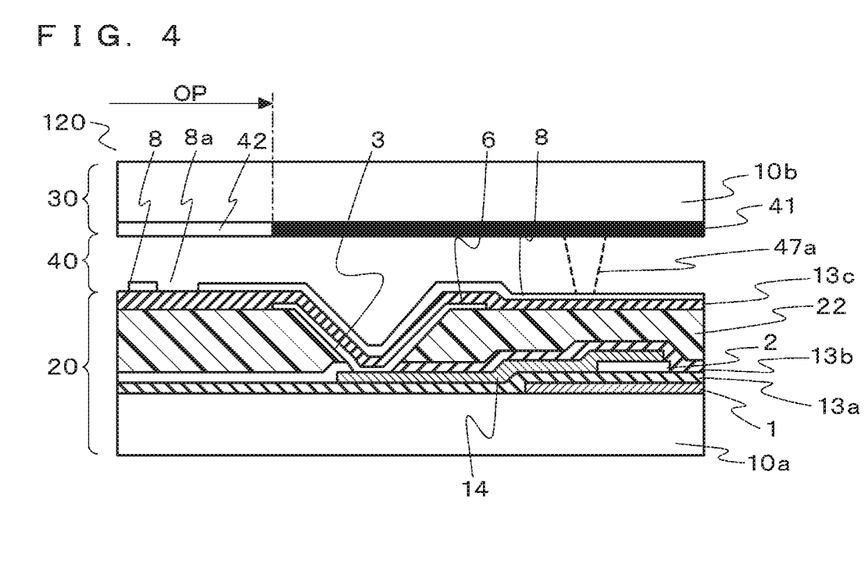
FIG. 4 is a cross-sectional view of the active matrix substrate and the liquid crystal display panel including the active matrix substrate, taken along the line B-B in FIG. 2.
Figure 5:
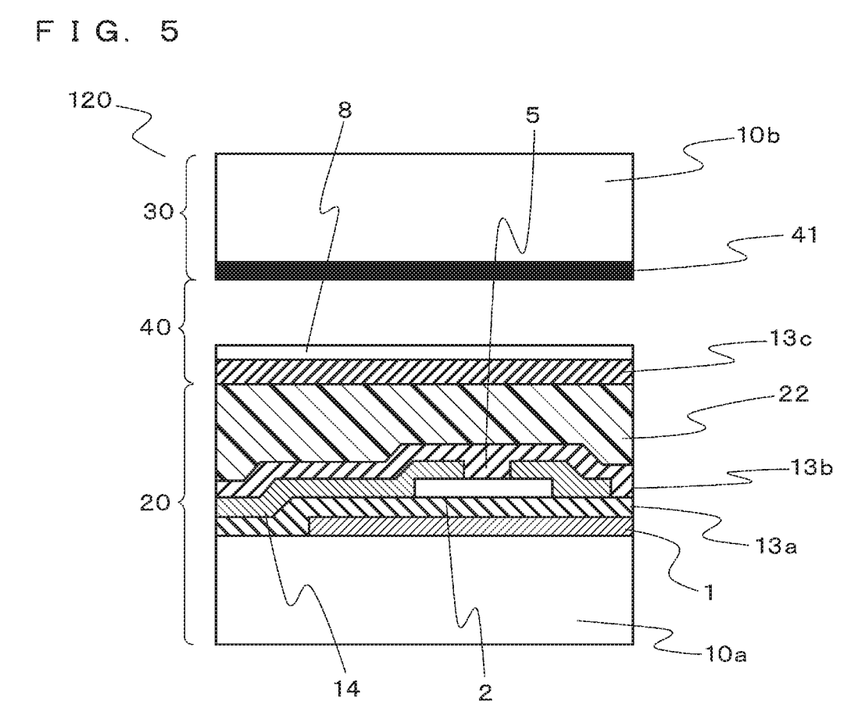
FIG. 5 is a cross-sectional view of the active matrix substrate and the liquid crystal display panel including the active matrix substrate, taken along the line C-C in FIG. 2.

Next, using FIG. 2 to FIG. 5, description is given of a preferred embodiment of the liquid crystal display panel according to the present invention. FIG. 2 is a plan view of the active matrix substrate that forms the liquid crystal display panel within a display region according to the first preferred embodiment. FIG. 3 to FIG. 5 are each a cross-sectional view of the liquid crystal display panel. FIG. 3 is a cross-sectional view of a part taken along the line A-A in FIG. 2, namely a cross-sectional view of the liquid crystal display panel having the active matrix substrate. FIG. 4 is a cross-sectional view of a part taken along the line B-B in FIG. 2, namely a cross-sectional view of the liquid crystal display panel having the active matrix substrate. FIG. 5 is a cross-sectional view of a part taken along the line C-C in FIG. 2, namely a cross-sectional view of the liquid crystal display panel having the active matrix substrate.

As illustrated in FIG. 3 to FIG. 5, the liquid crystal display panel 120 includes the active matrix substrate 20 and the counter substrate 30 that are arranged so as to be opposed to each other, a liquid crystal layer 40 provided between both of the substrates, and a sealing member (not shown) for attaching both of the substrates to each other and for sealing the liquid crystal layer 40 between both of the substrates.

In the counter substrate 30, a black matrix 41 for blocking visible light, a colored layer 42 being a filter for converting light so as to have a desired color (red, green, blue, etc., for example), and a photospacer 47 are formed. A region where the black matrix 41 is not formed allows light to be transmitted, and hence may be referred to as an opening region OP. On the other hand, a region where the black matrix 41 is formed may be referred to as a light-blocking region. The photospacer 47 (which may also be referred to as a spacer or a columnar spacer) is formed in the light-blocking region, projects toward the active matrix substrate 20, and is brought into abutment against the active matrix substrate 20. With such a structure, a cell thickness, being a thickness of the liquid crystal layer 40 between the active matrix substrate 20 and the counter substrate 30, is maintained.

Now, firstly, description is given of a basic structure the active matrix substrate 20 using FIG. 2 to FIG. 5, and then, detailed description is given of a structure of the liquid crystal display panel relating to the effects of the present invention. The gate wire 1 extending along a first direction is formed on a first transparent substrate 10a such as a glass substrate or a resin substrate. The gate wire 1 is formed by patterning a metallic film such as Al, Mo, Ti, Cr, Ta, and Cu having the thickness of approximately from 100 nm to 500 nm. A gate insulating film 13a made of an insulating film such as a silicon oxide and a silicon nitride is provided so as to cover the gate wire 1.

A semiconductor layer 2 made of silicon or an oxide semiconductor material such as In—Ga—Zn—O is formed so as to be partially overlapped at least with the gate wire 1 on the gate insulating film 13a and to have the thickness being approximately from 100 nm to 300 nm. In an upper layer of the gate insulating film 13a, the source wire 4 that intersects with the gate wire 1 and extends in a second direction is formed. A region partitioned by intersection of a plurality of gate wires 1 and a plurality of source wires 4 corresponds to a pixel.

Twelve pixels are illustrated in FIG. 2, but the number is not limited to twelve. A pixel corresponds to each color, and four pixels of pixels PXR1, PXR2, PXR3, and PXR4 in FIG. 2 denote pixels corresponding to red (R). Four pixels of pixels PXG1, PXG2, PXG3, and PXG4 denote pixels corresponding to green (G). Four pixels of pixels PXB1, PXB2, PXB3, and PXB4 denote pixels corresponding to blue (B). For example, the color of light transmitted through the colored layer 42 that is opposed to the pixels PXG1, PXG2, PXG3, and PXG4 is green. Other pixels are also opposed to respective colored layers that allow light having corresponding colors to be transmitted. As in the later description, in this preferred embodiment, the pixel PXG1 may be referred to as a first pixel, the pixels PXG2 to PXG4 as second pixels, and the other pixels as third pixels.

The source wire 4 has a region that also extends on the semiconductor layer 2. A drain connection electrode 14 is formed so as to be opposed to the source wire 4 on the semiconductor layer 2, and a region where the source wire 4 and the drain connection electrode 14 are opposed to each other may also be referred to as a channel region. Note that, a drain connection electrode extended portion 14a is formed in the drain connection electrode 14 only for the pixels PXG1 to PXG4. The description thereof will be given later in detail.

The source wire 4 and the drain connection electrode 14 are formed by patterning a single layer or a stacked structure of a metallic film such as Al, Mo, Ti, Cr, Ta, and Cu or an alloy film thereof having the thickness approximately from 100 nm to 500 nm. Although not shown, in a case where the semiconductor layer 2 is made of silicon, an ohmic layer obtained by adding impurity such as phosphorus to silicon may be formed so as to be sandwiched between the semiconductor layer 2 and the drain connection electrode 14. In such a case, an ohmic layer on the channel region, where the drain connection electrode 14 and the source wire 4 are opposed to each other, needs to be removed. From the elements above, the thin film transistor 5 being a switching element is formed.

A first interlayer insulating film 13b and an organic resin film 22 provided on the first interlayer insulating film are formed so as to cover the source wire 4 and the drain connection electrode 14 being elements of the thin film transistor. As the first interlayer insulating film 13b, an inorganic insulating film such as a silicon oxide and a silicon nitride may be used. As the organic resin film 22, a film obtained by being coated by acryl or polyimide with the thickness of from 1 μm to 3 μm and then being fired may be used. Note that, only the first interlayer insulating film 13b may be formed, without forming the organic resin film 22.

On the organic resin film 22, the pixel electrode 6 is provided so as to be arranged in a matrix pattern for each pixel. In FIG. 2, each pixel electrode 6 is illustrated as such a shape that a rectangular pattern that reflects a pixel shape projects so as to have a through-hole 3 in a part thereof. Each pixel electrode 6 is made of a transparent conductive film having the thickness of approximately from 50 nm to 150 nm, and is formed so as to be at least partially overlapped with the drain connection electrode 14 in top view. As a material of the transparent conductive film, an indium-tin-oxide (ITO) and an indium-zinc-oxide (IZO) may be used. Further, the pixel electrode 6 and the drain connection electrode 14 are electrically connected via the through-hole 3 that is opened in the organic resin film 22 and the interlayer insulating film 13b. The through-hole 3 is formed on the inner side with respect to a portion of the gate wire 1 that is processed to have the smallest width in top view.

Further, the photospacer 47 is formed on the counter substrate 30 so as to correspond to the vicinity of the through-hole 3. Further, a pixel provided with the photospacer 47 in FIG. 2 is only the pixel PXG1 as a first pixel, and a photospacer is not formed in the other pixels. Although a photospacer is not arranged in actuality, a photospacer corresponding position 47a is also illustrated with the dotted line. The photospacer corresponding position 47a is virtually illustrated for giving description in contrast to the first pixel in which a photospacer is arranged. The description thereof will also be given later.

A second interlayer insulating film 13c is formed so as to cover the pixel electrode 6 and the organic resin film 22. As the second interlayer insulating film 13c, an inorganic insulating film such as a silicon oxide and a silicon nitride may be used.

On the second interlayer insulating film 13c, a common electrode 8 is formed so as to be overlapped with each pixel electrode 6 in top view. The common electrode 8 is made of a transparent conductive film having the thickness of approximately from 50 nm to 150 nm. As a material of the transparent conductive film, an indium-tin-oxide (ITO) and an indium-zinc-oxide (IZO) may be used. Further, the common electrode 8 is formed in substantially the entire surface in the display region 51 as described above, with a slit 8a being formed in each pixel.

The slit 8a is a region where the common electrode 8 is not formed, and therefore the second interlayer insulating film 13c as an undercoat is exposed in the slit 8a. FIG. 2 illustrates an aspect in which the common electrode 8 stretches across the entire surface in a region except the slit 8a.

Further, an alignment film (not shown) for aligning liquid crystal molecules is formed so as to cover the common electrode 8. Note that, the alignment film is also formed on a side of the counter substrate 30 to come in contact with the liquid crystal layer.

The array structure illustrated in FIG. 2 is one aspect of a fringe field switching (FFS) mode. In an FFS mode, liquid crystal molecules of the liquid crystal layer 40 are driven by a fringe electric filed generated between each pixel electrode 6 and the common electrode 8 at an edge of the slit 8a, to thereby enable display in each pixel. Accordingly, in each pixel, visible light transmitted through a region where the pixel electrode 6 and the common electrode 8 are overlapped contributes to display, and in order to prevent colors from being mixed between the pixels, the black matrix 41 is formed in a region corresponding to a portion between the pixel electrodes 6.

In FIG. 2, the region surrounded by the dotted rectangle is a region contributing to display. A region other than the above is a region opposed to the black matrix 41 on the counter substrate 30, and therefore does not contribute to display. On the other hand, in the counter substrate 30, the black matrix 41 is not formed in a region opposed to the region that is surrounded by the dotted rectangle in FIG. 2, but the colored layer 42 through which light having a color out of red (R), green (G), blue (B), etc. is transmitted is formed. This region may be referred to as an opening region OP, in contrast to the region where the black matrix 41 is formed.

The opening regions of the pixels PXG1 to PXG4 are illustrated to be smaller in area than opening regions of the other pixels in FIG. 2. The description thereof will also be given later.

Figure 6:
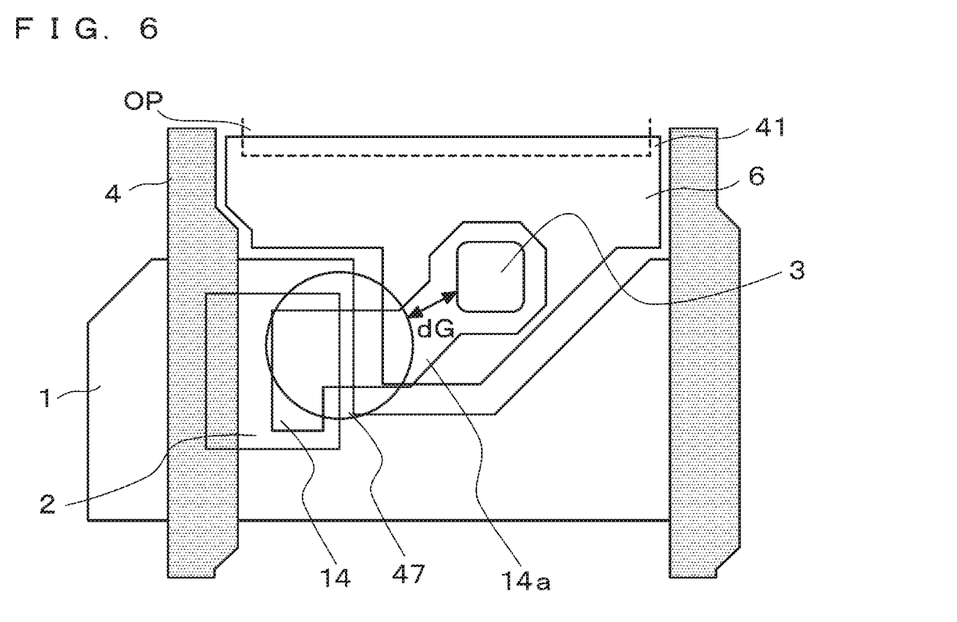
FIG. 6 is an enlarged plan view of a part of FIG. 2.
Figure 7:
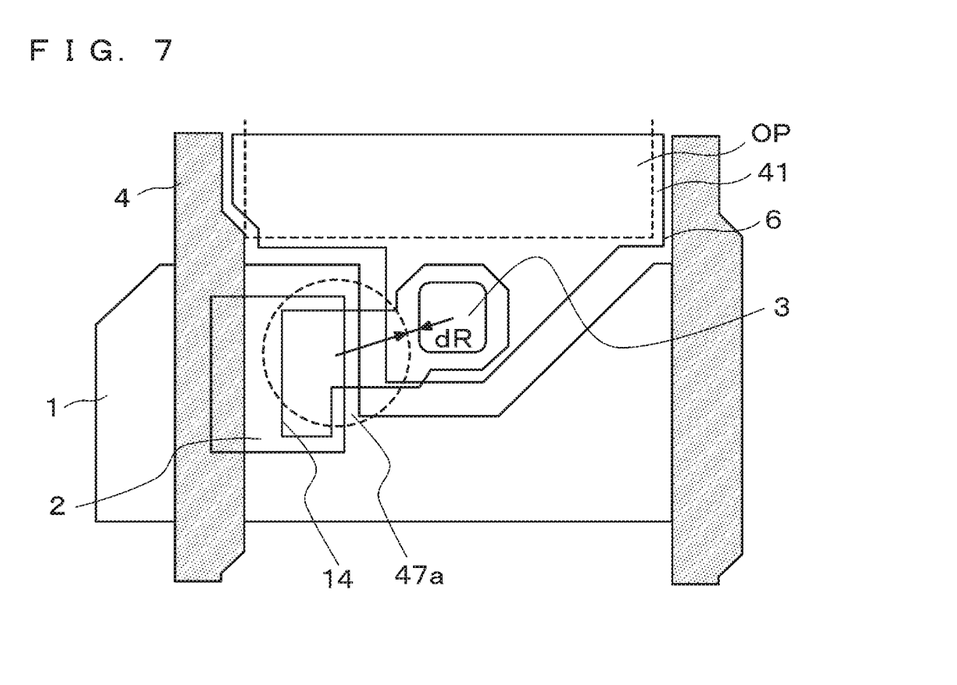
FIG. 7 is an enlarged plan view of a part of FIG. 2.

FIG. 6 is an enlarged plan view of a part of the first pixel PXG1 of FIG. 2. FIG. 7 is an enlarged plan view of a part of a third pixel except the pixels PXG1 to PXG4. Further, as in the above description, FIG. 6 illustrates an aspect in which the photospacer 47 is arranged, but FIG. 7 virtually illustrates the photospacer corresponding position 47a.

Further, FIG. 2 illustrates an aspect in which the photospacer 47 is arranged only in the first pixel PXG1 among the pixels PXG1 to PXG4. The density of forming photospacers in the display region is usually approximately from 0.01% to 0.03%, roughly with a ratio of 1 pixel to 20-50 pixels depending on the area. Thus, also in this preferred embodiment, an aspect in which the photospacer 47 is not arranged in the second pixels PXG2 to PXG4 is illustrated. Now, using the drawings, description is given of the liquid crystal display panel according to this preferred embodiment.

The drain connection electrode 14 in the pixels PXG1 to PXG4 illustrated in FIG. 6 has the drain connection electrode extended portion 14a. On the other hand, the drain connection electrode extended portion 14a is not formed in the pixels PXR1 to PXR4 illustrated in FIG. 7. That is, the drain connection electrode 14 of the pixels PXG1 to PXG4 is longer than the drain connection electrode 14 of the other pixels. Therefore, a distance dG between the photospacer 47 and the through-hole 3 that are arranged in the vicinity of the thin film transistor in the pixels PXG1 to PXG4 can be set to be larger than a distance dR between the photospacer corresponding position 47a and the through-hole 3 in the other pixels.

Accordingly, as compared to a hypothetical case of arranging the photospacer 47 in the photospacer corresponding position 47a in the pixels PXR1 to PXR4, a distal portion of the photospacer 47 may be less liable to fall into the through-hole 3 in the aspect of the pixels PXG1 to PXG4.

In the above, description has been given of a relative positional relationship between the through-hole 3 and the photospacer 47. Next, description is given of a positional relationship between the opening region and the photospacer 47. In a case where the photospacer 47 is formed, the photospacer 47 and its vicinity do not contribute to display, and hence light needs to be blocked by forming the black matrix 41. In this preferred embodiment, the area of the opening region in the pixels PXG1 to PXG4 where the photospacers are arranged is reduced as compared to that in the other pixels so as to increase the area of the black matrix 41. With this, light can be sufficiently blocked in the vicinity of the photospacer 47.

Further, in this preferred embodiment, color balance of the pixels PXR1, PXG1, and PXB1 of the liquid crystal display panel is also taken into consideration. In order to display white using 3 types of pixels of red (R), green (G), and blue (B), for example, color balance needs to be designed. In the adjustment of the balance, the area of opening regions of pixels of a certain color needs to be changed in some cases. In this preferred embodiment, description has been given in consideration of an aspect in which color balance may be adjusted by reducing the area of the opening region of the pixels of green (G). However, for example, if the area of the opening regions of the pixels of blue (B) needs to be reduced in order to adjust color balance, an aspect of providing the photospacers only in the pixels PXB1 to PXB4 may be employed.

Accordingly, it can be said that the first preferred embodiment has a feature in that, in the pixel required to reduce its area of an opening region in order to adjust color balance of a color filter, the area of a black matrix is increased to provide a photospacer and then an extended portion is provided in a drain connection electrode, to thereby prolong the distance between a photospacer and a through-hole further than that in other pixels.

Such accounts for the area of the opening regions in the pixels PXG2 to PXG4 where the photospacer is not formed being similarly smaller as in the case of the pixel PXG1 than that in the opening regions in the other pixels in FIG. 2.

In any case, the first preferred embodiment has effects capable of achieving color balance of a color filter, preventing display failure caused by a photospacer, and preventing a photospacer from falling into a through-hole.

Second Preferred Embodiment

In the first preferred embodiment, the shape of the drain connection electrodes of only particular pixels is changed to change the distance between the photospacer and the through-hole, to thereby prevent the photospacer from falling into the through-hole. The second preferred embodiment has a feature in using, in addition to a photospacer used in the first preferred embodiment, a spacer having a smaller height than such a photospacer. Now, description thereof is given using the drawings.

Figure 8:
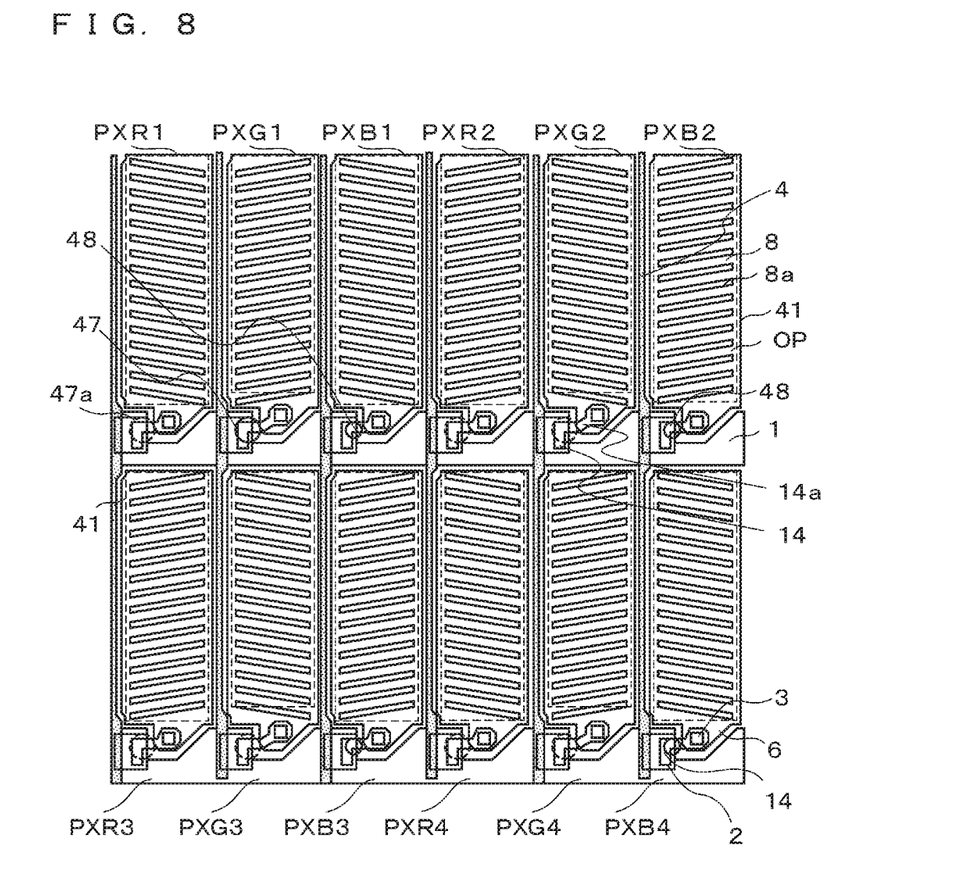
FIG. 8 is a plan view of an active matrix substrate that forms a liquid crystal display panel of a second preferred embodiment of the present invention.

FIG. 8 is a plan view of an active matrix substrate similarly to FIG. 2. Difference from the first preferred embodiment is that a second photospacer 48 is provided in each of the pixels PXB1 to PXB4, and that the area of the opening regions OP in the pixels PXB1 to PXB4 is formed to be larger than that of the opening regions OP in the pixels PXG1 to PXG4 and smaller than that of the opening regions OP in the pixels PXR1 to PXR4.

Here, the second photospacer 48 provided in each of the pixels PXB1 to PXB4 has a height smaller than the first photospacer 47 provided in the pixel PXG1. Further, the second photospacer 48 is not brought into abutment against the active matrix substrate in a usual state. When photospacers having different heights are mixed in this manner, a physical impact such as pressing or a low-temperature impact on the liquid crystal display panel is absorbed by the difference in elastic characteristics of each of the photospacers, thereby attaining the effect of preventing generation of air bubbles in liquid crystals caused by such an impact.

Further, FIG. 8 assumes a case where, concerning the area of the opening regions in the pixels PXB1 to PXB4, the area of the opening region needs to be increased in the order of green (G), blue (B), and red (R) in view of the above-mentioned color balance. In this manner, the area of opening regions may be changed for each color as appropriate in view of color balance. Then, photospacers may be provided only in pixels that are most required to reduce the area of the opening regions.

FIG. 8 illustrates both of an aspect of adding the second photospacer and an aspect of reducing the area of the opening regions in the pixels PXB1 to PXB4, but as a matter of course, only either one thereof may be applied.

As in the above description, according to the liquid crystal display panel 120 of this preferred embodiment, a pixel in which the photospacer 47 is arranged so as to be apart from the through-hole 3 is provided. Therefore, the photospacer 47 is prevented from falling into the through-hole 3 at the time when the active matrix substrate 20 and the counter substrate 30 are attached. With this, a cell gap is securely maintained. Also in a process of attaching both of the substrates, highly precise positional adjustment in consideration of attachment misalignment or the like can be eliminated. Accordingly, stability in cell thickness control owing to a photospacer can be maintained, and reduction of an aperture ratio of a pixel can be prevented.

Further, according to the liquid crystal display panel 120 of this preferred embodiment, without moving the position of the photospacer 47 on the gate wire 1, the position of the through-hole 3 can be adjusted in accordance with a region where light is blocked by the black matrix 41 of the counter substrate 30. Hence, the liquid crystal display panel 120 of this preferred embodiment is effective also as a curved liquid crystal display panel that requires advanced attachment adjustment. Further, the liquid crystal display panel 120 of this preferred embodiment can also be applied to a display device having a curved display screen. Further, reduction of an aperture ratio of a pixel can be prevented in a high-resolution liquid crystal display panel as well.

As in the above description, according to the present invention, stability of cell thickness control owing to a photospacer can be maintained and reduction of an aperture ratio of a pixel can be prevented in a liquid crystal display panel having an adjusted transmission area in a counter substrate in order to adjust whiteness.

Note that, in the preferred embodiments of the present invention, description has been given exemplifying an FFS-type active matrix substrate, but the present invention is not limited thereto. For example, the method of the present invention is also applicable to a semitransparent type having both of a transparent pixel electrode and a light-reflecting pixel electrode as its pixel electrodes and the like by providing a through-hole or an opening that is opened in a resin film, in a case where similar problems may arise.

Further, a through-hole is not limited to be connected to a pixel electrode. For example, in a case where a wire for supplying a common potential to a common electrode is separately formed, a through-hole may be opened in an insulating film in order to connect the wire and the common electrode. Also in such an aspect, the preferred embodiments of the present invention can be applied.

Further, in the preferred embodiments of the present invention, an aspect in which a colored layer is formed of three colors of red, green, and blue has been employed, but as other colors, yellow, white, etc. may be added. As the types of colors of a colored layer, the minimum of two colors suffices.

Further, description has been given of an aspect in which the black matrix and the colored layer are formed on the counter substrate, but those may be formed on the active matrix substrate. For example, in FIG. 3 to FIG. 5, the colored layer 42 and the black matrix 41 may be formed by at least any one of the interlayer insulating films 13b and 13c and the resin film 22.

In the liquid crystal display panel described in the first and second preferred embodiments, when a polarizing plate is attached to its both surfaces, a drive circuit is mounted, and a backlight having a light source such as an LED and a reflective sheet is combined together, a liquid crystal display module is formed. Further, when the liquid crystal display panel is incorporated in to a casing and connection is enabled, a liquid crystal display device is formed.

While the invention has been shown and described in detail, the foregoing description is in all aspects illustrative and not restrictive. It is therefore understood that numerous modifications and variations can be devised without departing from the scope of the invention.

What is claimed is:

1. A liquid crystal display panel comprising:
    an active matrix substrate;
    a counter substrate arranged so as to be opposed to the active matrix substrate; and
    a liquid crystal layer provided between the active matrix substrate and the counter substrate, wherein
    the active matrix substrate comprises:
        a first transparent substrate;
        a plurality of gate wires formed on the first transparent substrate;
        a plurality of source wires that intersect with the gate wires;
        a plurality of pixels, wherein each of the plurality of pixels is partitioned by the gate wires and the source wires and includes a switching element; and
        a pixel electrode that is formed through intermediation of an insulating film with respect to the switching element, and that is connected to the switching element via a through-hole opened in the insulating film, the counter substrate comprises a second transparent substrate, and a spacer that is formed on the second transparent substrate and is brought into abutment against the active matrix substrate, the plurality of pixels comprises a first pixel, a plurality of second pixels, and a plurality of third pixels, each of the first pixel, the plurality of second pixels, and the plurality of third pixels having:
- a light-blocking region where light is not transmitted; and
- an opening region through which light corresponding to one color out of a plurality of types of colors is transmitted, the first pixel is brought into abutment against the spacer in the light-blocking region, the plurality of second pixels are not brought into abutment against the spacer, the plurality of third pixels include all pixels of the plurality of pixels on the active matrix substrate that have an opening region corresponding to a color different from the color of the opening region of the first pixel and the plurality of second pixels, an area of the opening region of the first pixel and an area of the opening region of each of the plurality of second pixels are each smaller than an area of the opening region of each of the plurality of third pixels, a position of the through-hole in the first pixel is different from a position of the through-hole in each of the plurality of third pixels, and the color of the light transmitted through the opening region in the first pixel and each of the plurality of second pixels is green.

2. The liquid crystal display panel according to claim 1, wherein white balance is adjusted with the color that corresponds to the first pixel and a color that corresponds to at least one of the third pixels.

3. The liquid crystal display panel according to claim 1, wherein a second spacer having a smaller height than the spacer is formed in the third pixels.

4. The liquid crystal display panel according to claim 1, wherein the insulating film comprises an organic resin film.

5. The liquid crystal display panel according to claim 1, wherein the liquid crystal display panel is curved.

6. The liquid crystal display panel according to claim 1, wherein the spacer does not overlap any of the source wires in a plan view.

7. The liquid crystal display panel according to claim 1, wherein a distance between the spacer and the through-hole in the first pixel is larger than a distance between a spacer corresponding position and the through-hole, the spacer corresponding position being provided in the third pixels virtually assuming that the spacer is arranged correspondingly to the first pixel.

8. The liquid crystal display panel according to claim 7, wherein
- the switching element has a drain connection electrode,
- the drain connection electrode and the pixel electrode are directly connected via the through-hole, and
- a length of the drain connection electrode in the first pixel is larger than a length of the drain connection electrode in the third pixels.

* * * * *